United States Patent [19]

Butchko

[11] Patent Number: 4,866,390

[45] Date of Patent: Sep. 12, 1989

[54] VEHICLE LIGHT TESTING SYSTEM FOR TESTING A PLURALITY OF LIGHTS USING A SCANNING SEQUENCE

[76] Inventor: Joseph R. Butchko, R.D. 2, Box 72, Temple, Pa. 19560

[21] Appl. No.: 83,816

[22] Filed: Aug. 11, 1987

[51] Int. Cl.$^4$ .................... G01R 31/02; B60Q 1/00
[52] U.S. Cl. .................... 324/504; 324/133; 324/509; 324/556; 340/458
[58] Field of Search ............... 324/503, 504, 509, 540, 324/556, 133; 340/636, 663, 52 F, 67, 81 R, 81 F, 82

[56] References Cited

U.S. PATENT DOCUMENTS

| | | | |
|---|---|---|---|
| 3,103,808 | 9/1963 | Eichelberger | 324/504 X |
| 3,428,888 | 2/1969 | Nolte | 324/504 |
| 3,495,172 | 2/1970 | Davis | 324/540 X |
| 3,500,315 | 3/1970 | Shimada | 340/82 |
| 3,622,980 | 11/1971 | Elledge, Jr. | 340/82 |
| 3,663,939 | 5/1972 | Olsson | 324/504 X |
| 3,737,767 | 6/1973 | Slutsky | 324/504 |
| 3,836,843 | 9/1974 | Yonce | 324/504 |
| 4,547,722 | 10/1985 | Sarlo | 324/504 |
| 4,586,370 | 5/1986 | Massender | 340/52 F X |

FOREIGN PATENT DOCUMENTS

| | | | |
|---|---|---|---|
| 2724670 | 12/1978 | Fed. Rep. of Germany | 324/503 |
| 3149115 | 6/1983 | Fed. Rep. of Germany | 324/504 |
| 1558565 | 1/1980 | United Kingdom | 324/504 |

*Primary Examiner*—Gerard R. Strecker
*Attorney, Agent, or Firm*—Antonelli, Terry & Wands

[57] ABSTRACT

A vehicle light testing system is provided for testing the lighting systems of a vehicle having a plurality of lights (which have different operating functions). The testing system includes an arrangement for scanning the plurality of lights in a predetermined scanning sequence. This scanning allows a single testing operator to check the different operating functions of the lights in a single trip around the vehicle. Thus, the scanning sequence can progress from the left turn signal to the brake lights to the right turn signal (and then repeat the cycle again) so that an operator in the back of the vehicle can watch the lights progress through this sequence. The system also includes a number of other features concerned with the testing of vehicle lights in conjunction with the scanning feature, including detection of shorts, bad grounds, and low testing battery voltage, as well as a "freeze" feature and a convenient system status indicator arrangement.

29 Claims, 5 Drawing Sheets

VEHICLE LIGHT TESTING SYSTEM FOR TESTING A PLURALITY OF LIGHTS USING A SCANNING SEQUENCE

FIELD OF THE INVENTION

This invention pertains to vehicle light testing systems, and, more particularly, to an improved veicle light testing system which allows a single testing operator to check a plurality of vehicle lights having different operating functions in a single trip around the vehicle.

BACKGROUND OF THE INVENTION

Testing of vehicle lighting is an important aspect of vehicle inspection. It has become standard in a number of situations to inspect vehicle lighting, and, of course, proper operation of a vehicle's lights can be crucial for safety purposes in the course of operation of the vehicles. Thus, in many states, it is now common practice to require periodic inspection of lighting systems of trucks, cars, airplanes and other vehicles.

The problem of ensuring proper vehicle lighting operation is particularly acute in the trucking industry because of the high mileage involved and the practice of frequently switching freight traiers from one tractor to another. Generally, a large number of such freight trailers will be located in pools at shipping points (e.g. railway yards, etc.) to be connected to an available tractor. In such situations, it is common practice to send a mechanic to these locations to inspect and repair the freight equipment. Inspection of the trailer's lights is part of this inspection to ensure that the trailer's lighting system will properly operate when it is connected to the tractor's lighting system by a suitable connector.

In the past, it has been common practice to use a spare tractor at the lot to connect to each of the trailers being tested in turn. With such a spare tractor, if only a single mechanic is making the inspection, it will be necessary for him to make two trips around the trailer. Specifically, the typical testing procedure begins with the mechanic first turning on one turn signal and the taillights and marker lights at the tractor. The mechanic will then go to the back of the trailer to check these lights. Following this, he must return to the tractor to switch to the other turn signal and to apply the brakes for checking the stop lights. The mechanic must then go to the back of the trailer again to check these other lights. It should be noted that most trailers combine taillights with other functions by using dual-filament bulbs. Therefore, in addition to having to check both turn signal indicators separately, the two trips are also required to ascertain that both of the filaments are lit and that the wiring is not reversed.

Of course, the testing can be accomplished more easily if two operators are present for testing. In that case, one will remain in the tractor to control the lights while the other checks the trailer lighting operation from the back. However, this is normally undesirable since it requires allocating two men to do the job.

As noted above, the use of the spare tractor has a number of disadvantages. Either two testing operators are required, or a single testing operator must make two trips around each trailer. This requires a single mechanic to walk an extra mile for every 35 trailers checked (calculated using standard 48-foot trailer) due to the extra trip required around each trailer. When one combines this extra walking with the fatigue involved in climbing in and out of the tractor repeatedly, it becomes a significan factor in reducing the efficiency of the mechanic.

In addition, the use of an extra tractor has a number of other disadvantages. For example, it is difficult, time-consuming and dangerous both to people and equipment to move a tractor around a crowded trailer lot to connect it to one trailer after the other. It is also expensive to operate the tractor, and runs down the battery of the tractor. A low battery in the tractor, or some other problem with the lighting system of the tractor, might be mistaken for a trailer lighting system problem. And, of course, if the tractor is being used for testing trailers, it will not be available for use on the road. Considering the costs of tractors, this latter point can be a significant disadvantage. Finally, it is necessary that the person doing the testing be qualified for driving the tractor, particularly considering the tight quarters that it is usually necessary to operate in on a crowded freight trailer lot.

Because of these difficulties, portable systems have been developed for checking the trailer lights without the need for connecting a tractor. U.S. Pat. No. 3,103,808 to Eichelberger and U.S. Pat. No. 3,737,767 to Slutsky are examples of such systems. In both of these systems, the testers are connected to the socket of the trailer where the tractor plug would normally be inserted. The tester contains switches which allow the operator to individually operate the various trailer lights.

In using the portable testing systems of U.S. Pat. Nos. 3,103,808 and 3,737,767, substantially the same testing procedure is used as in the case of a spare tractor. In other words, the mechanic will turn on one turn signal, the taillights and the marker lights at the front of the trailer where the light input socket is located, and then go to the back of the trailer to check these. Subsequently, he will return to the front of the trailer to switch to the other turn signal and the braking lights and then go back to the trailer again to check these other lights. In short, even with such portable testers, two trips around the trailer are required.

In addition to the disadvantage of extra walking, these previous testers do not provide a safe enclosure for the testing battery. Thus, a safety hazard exists for acid spills from the exposed battery. Also, the systems do not include an arrangement fo stopping the testing operation if the testing battery is low. Therefore, a low battery might be mistaken for an improperly operating trailer light.

Accordingly, although the portable testers disclosed in U.S. Pat. Nos. 3,103,808 and 3,737,767 represent a definite improvement over the use of a spare tractor, they still have certain drawbacks.

SUMMARY OF THE INVENTION

Accordingly, it is an object of the present invention to provide an improved vehicle light testing system.

It is a further object of the present invention to provide an apparatus which allows a single operator to test vehicle lights including both the left and right turn signals and brake lights with a single trip around the vehicle.

A still further object of the present invention is to provide an apparatus for testing all major lights for a trailer in a single trip around the trailer, including an arrangement for detecting short circuits and bad grounds in the trailer lighting.

To accomplish these and other objects, the present invention provides a vehicle light testing system for testing the lighting systems of a vehicle having a plurality of lights (which have different operating functions) which includes an arrangement for scanning the plurality of lights in a predetermined scanning sequence. This scanning allows a single testing operator to check the different operating functions of the lights in a single trip around the vehicle. Thus, the scanning sequence can progress from the left turn signal to the brake lights to the right turn signal (and then repeat the cycle again) so that an operator in the back of the vehicle can watch the lights progress through this sequence. The invention also includes a number of other features concerned with the testing of vehicle lights in conjunction with the scanning feature.

DETAILED DESCRIPTION OF THE INVENTION

Figure 1:
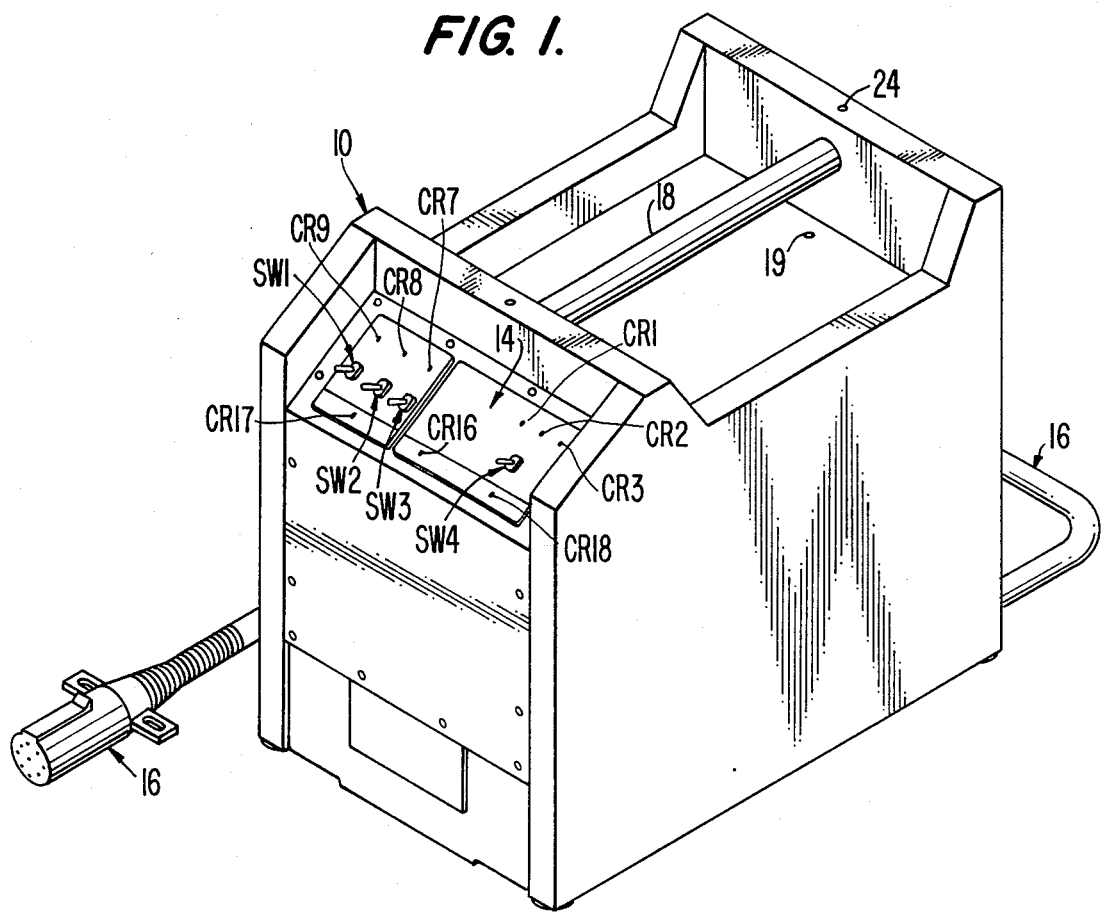
FIG. 1 provides a perspective view of an enclosure for the test apparatus from the front side, showing the control panel.
Figure 2:
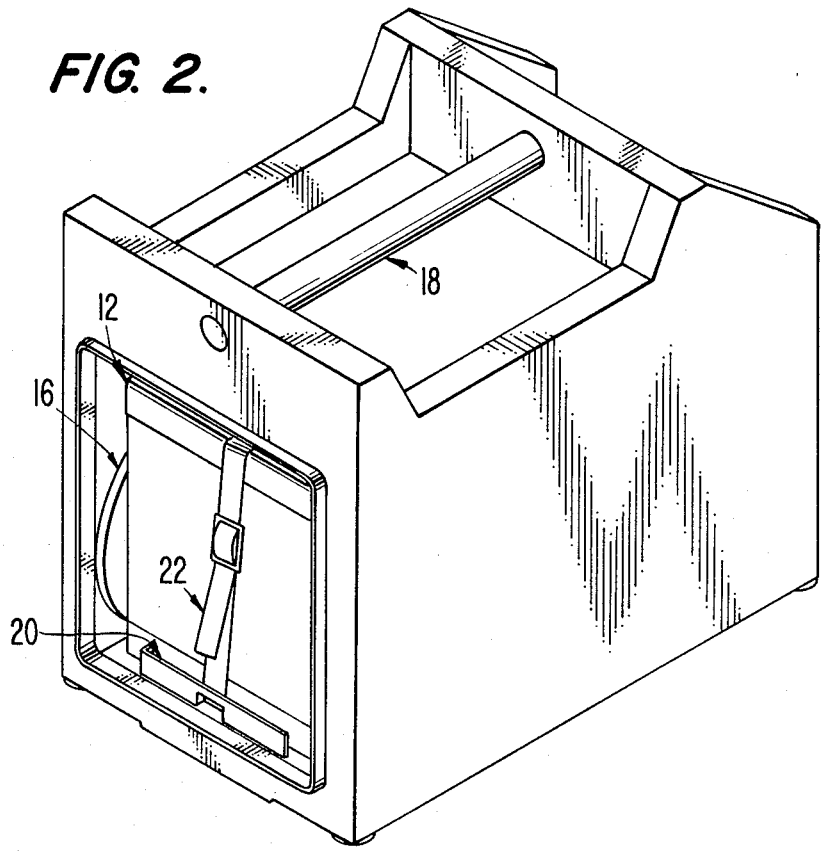
FIG. 2 is a perspective view of the enclosure for the test apparatus from the rear side showing a testing battery inserted in the enclosure.

FIGS. 1 and 2 illustrate an enclosure 10 including the testing system, a testing battery 12, a control panel 14 and a multi-prong connecting cord 16.

The detailed description which follows will be directed to a particular preferred embodiment of the present invention for use in testing trailer lights of freight trailers. However, it should be noted that the present invention is not limited to only testing freight trailers. Instead, it could find use in a wide variety of situations where vehicle lighting must be tested. For example, the present invention would be very useful for testing commercial car fleets (e.g. rental cars, company cars, taxis, etc. by providing a central socket for each car for controlling the lights of the car with the testing system of the present invention. This same arrangement could be used for testing cars for purposes of state safety inspections. Also, other vehicles such as recreational trailers, buses, planes, boats, tractors (including truck tractors), etc., could be checked using the present invention, provided a suitable connection was made to the lighting system of the vehicle being tested.

Returning now to FIGS. 1 and 2, the enclosure 10 is preferably made of a strong plastic material such as molded polyethylene (preferably as a single molded member). A steel tubular handle 18 is provided for carrying purposes. Also, as illustrated, the top of the enclosure 10 can be formed to provide a tray for carrying tools, spare bulbs, etc., for the purpose of effecting repairs upon determination of a faulty light, switch, etc. A tray drain hole 19 can be provided to allow drainage of any liquid in the tray to the bottom of the enclosure 10.

To allow use with a conventional multi-prong trailer socket, the testing apparatus of the present invention includes a 7-prong connecting cord 16. Of course, the number of prongs is optional, depending upon the vehicle being tested. Seven-prongs is presently a standard in the trucking industry for connections between tractors and trailers since it allows for powering the taillights, marker lights, turn signals, stop lights and any auxiliary equipment (e.g. back-up lights, trailer interior lights, back-up warning beepers, etc.).

As shown in FIG. 2, an opening is provided in the back of the enclosure 10 to allow for insertion of the battery 12. Preferably, the battery is located on a battery pan 20 (e.g. aluminum), and is strapped securely in place with a battery strap 22 (e.g. nylon). As also shown in FIG. 2, the cord 16 can conveniently be stored in an area next to the battery 12 when testing is not being carried out. Although the invention is not particularly limited to this, the area for holding the battery is preferably designed to hold a standard 12-volt car or truck battery. A typical maximum size for such a battery would be 10 inches in length, 7 inches in width and 9 inches in height, although the invention is not limited to this. It should also be noted that in the illustrated enclosure 10, the testing circuit to be described in detail hereinafter is located behind the control panel 14 in a manner to be completely isolated from the battery 12. Access to the testing system for repair can be gained through removal of the control panel 14.

The enclosure 10 is designed to essentially be leak-proof when the unit is on its side. The enclosure will include drain holes in the bottom (not shown) to allow any leaked acid from the battery to flow out the bottom of the enclosure. It should also be noted that the enclosure has a vent hole 24 at the upper rear portion of the enclosure to allow venting of battery gases away from the user. If desired, a hinged door can be provided over the rear opening in the enclosure for concealing the battery. It should be noted that the battery strap 22 is safety feature which allows not only holding the battery in place during normal operation, but also for containing pieces by holding the top onto the battery if a battery explosion occurs.

The control panel 14 is arranged to provide the necessary switches for carrying out the testing. It also provides indicators (preferably light emitting diodes) for providing the user with information regarding the status of the testing. For example, switches SW1, SW2 and SW3 are provided for powering up the auxiliary circuit (back-up lights, etc.), marker lights and taillights, respectively. Indication that the switches SW1, SW2 and SW3 are in their ON position is provided by the LEDs CR9, CR8 and CR7, respectively.

Switch SW4 on the control panel 14 is a three-way mode selec switch having positions of AUTO/OFF/-FREEZE. This three-way mode select switch initiates sequential scanning in a manner which will be discussed in detail later on. Basically, in the AUTO position of switch SW4, the lights of the trailer will repeatedly go through a predetermined sequence of "left turn signal, brake light, right turn signal." In the freeze position, (FRZ) of the switch SW4, the testing will be isolated to whatever point in the sequence the lights were at when SW4 was switched into the FRZ position. This allows the mechanic to track down a problem with a particular light if he notices faulty operation during the sequencing.

In order to indicate the status of the sequencing operation, LEDs CR1, CR2 and CR3 are provided above the switch SW4. CR1 indicates that the left turn signal is being operated, CR2 indicates that the brake lights are being operated, and CR3 indicates that the right turn signal is being operated. In addition to these LED indicators, the control panel 14 also indicates a low testing battery power through the LED indicator CR16. This will advise the user that the testing battery power has decreased below a predetermined level. (It should be noted that the present invention also includes a feature of turning off the scanning operation if the battery power decreases even further, as will be discussed later. Further, short circuits in the lighting system being tested will be indicated by indicator lights CR17 and CR18, in a manner which will also be described in detail hereinafter.

The control panel 14 is preferably made to be weatherproof by forming a polycarbonate overlay on it with integral windows at the LED locations. Also, rubber boots are provided on the switches of the control panel 14 to assist in this weatherproofing.

In peration for testing a trailer lighting system, the following procedure can be followed by the operator using the control panel 14.

1. Connect the 7-prong connecting cord 16 to the corresponding socket in the front of the trailer being checked.
2. Turn ON the auxiliary switch SW1 to light the indicator CR9 above the switch and apply power to the auxiliary circuits of the trailer.
3. Turn ON the marker light switch SW2 to light the indicator CR8 above the switch and apply power to the marker lights of the trailer.
4. Turn ON the taillights switch SW3 to light the indicator CR7 above the switch and apply power to the taillights of the trailer.
5. Set the three-way mode select switch SW4 to the "AUTO" position to start the scanning circuit to drive power relays in the control circuitry in an ON/OFF sequence to sequentially activate the left turn signal, the brake light, and the right turn signal.
6. Walk around the trailer and observe the operation of all of the lights to verify that they are wired correctly and operating correctly.
7. Return to the testing apparatus and either turn the three-way mode select switch SW4 to an OFF position if all lights are operating properly or to the FRZ position to freeze the scanning function in one of the three statuses indicated by the LED indicators CR1, CR2 and CR3 if any error is detected in the operation of the turn signals or stop light.

Figure 3:
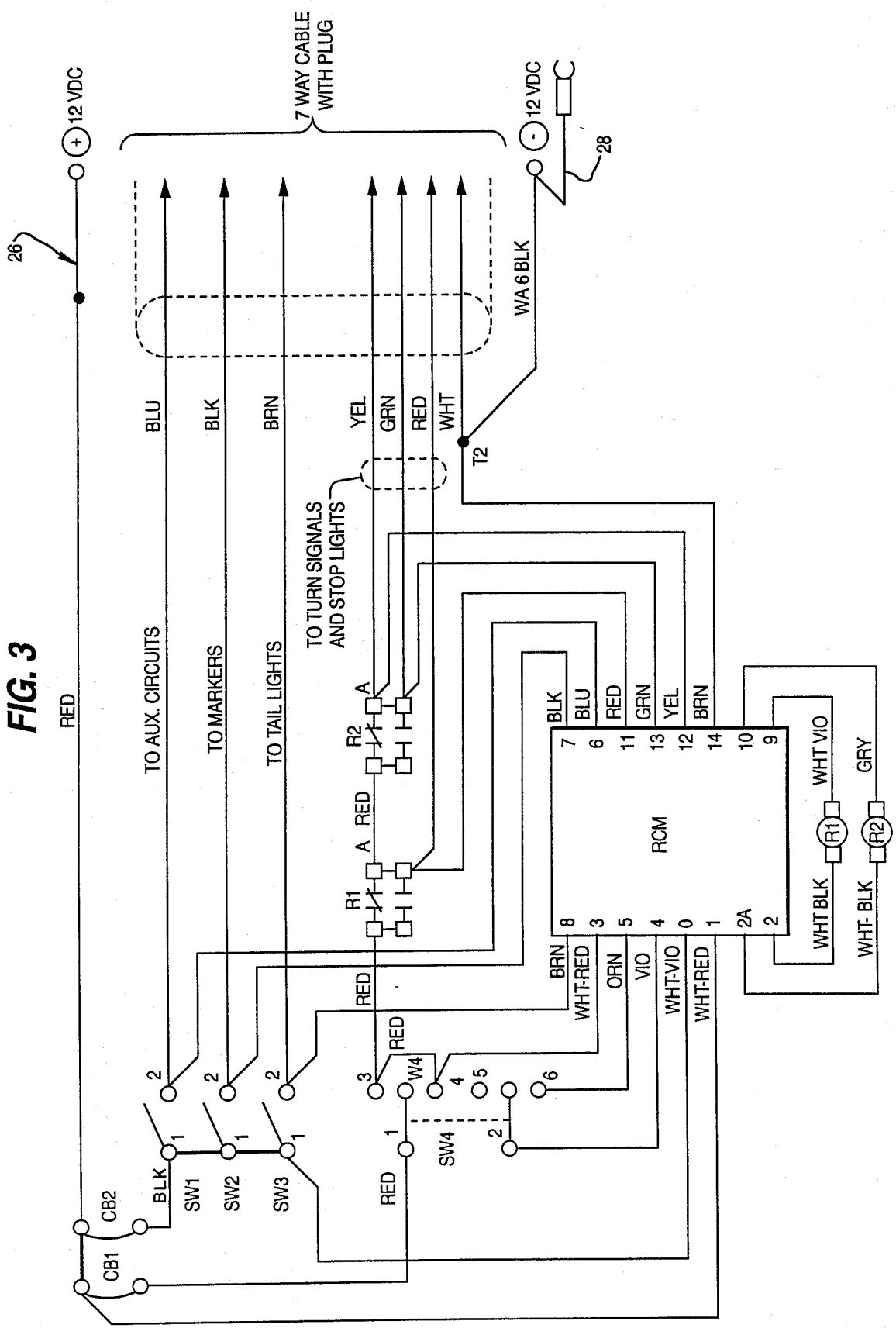
FIG. 3 is an overall circuit diagram of a preferred embodiment of the present invention.

FIG. 3 shows a wiring arrangement for connecting the switches and indicator LEDs shown on the control panel 14 of FIG. 1 to the seven wires of the 7-way cord 16, to the relays R1 and R2 for implementing the scanning operation and to the relay control module RCM. RCM is the heart of the testing system, and will be explained in further detail later with respect to FIGS. 4 and 5.

As can be seen in FIG. 3, the switches SW1, SW2 and SW3 (which are all preferably single-pole-single-throw toggle switches) are connected to the positive terminal of a 12-volt battery (e.g. testing battery 12 of FIG. 2) through a circuit breaker CB2 (e.g. a 20-amp circuit breaker in the present preferred embodiment). Similarly, the switch SW4 (which preferably is a double-pole-double-throw toggle switch with a center-off position) is connected to the positive terminal of the battery through a circuit breaker CB1 (preferably 15 amps). CB1 and CB2 can be auto-reset circuit breakers (commercially available in the automotive industry) which will go into an open circuit position for a predetermined period of time when the current flow exceeds the rated level. Thus, if a short circuit exists in the auxiliary circuit, the marker lights or the taillights, CB2 will open immediately when the switch (e.g. SW1-SW3) corresponding to the short circuit location is closed. This will turn on LED CR17 which is located across terminals 0 and 1 of RCM (e.g. see FIG. 5 for this connection). Similarly, if a short circuit exists in one of the turn signals or the brake lights, it will open CB1 when SW4 is connected to begin the sequencing operation. This will light LED CR18 connected across the terminals 1 and 3 of RCM (e.g. see FIG. 5).

In accordance with one feature of the present invention, the circuit breakers are provided as auto-reset circuit breakers because, in trailer lighting systems, it is not uncommon for temporary short circuits to occur. Therefore, by using auto-reset circuit breakers, after a predetermined time the auto-reset circuit breaker will reset to allow testing to continue if, in fact, the short circuit was a temporary condition.

Figure 5:
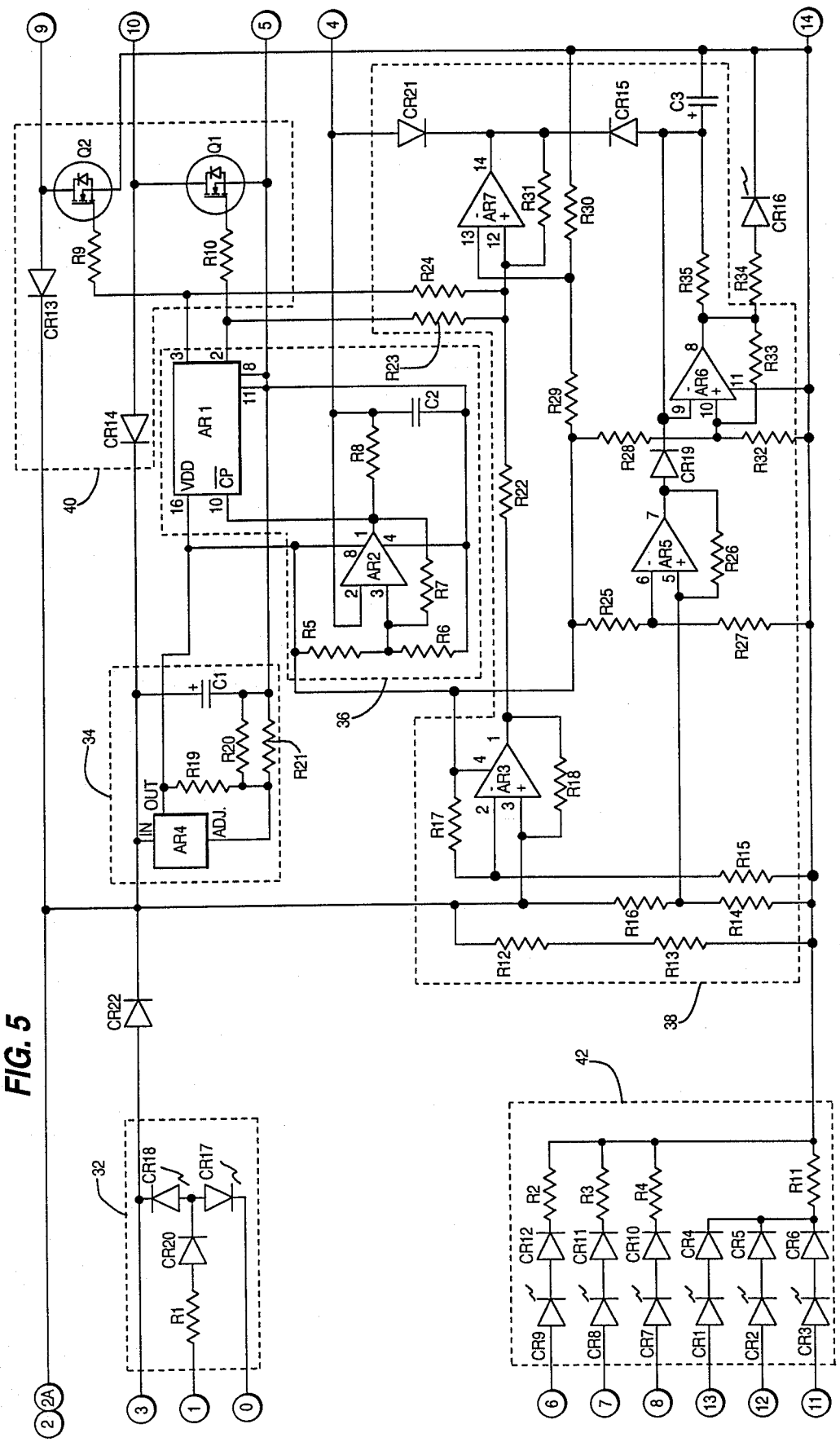
FIG. 5 is a detailed schematic diagram of the relay control module RCM of FIG. 3.

When any one of the switches SW1-SW3 is closed, power is provided both to the corresponding wire of the 7-way cord 16 connected to the switch (for powering up the appropriate circuit) and to an input (e.g. terminals 6, 7 or 8) of RCM for lighting an appropriate one of the status indicator lights CR7, CR8 or CR9 (e.g. see FIG. 5). Similarly, when the switch SW4 is switched to its UP position (e.g. terminals 3 and 5 for the AUTO mode), power is provided to the relays R1 and R2 which will be supplied to the turn signals and the brake lights in a sequence which will be determined by RCM. Specifically, the scanning circuit within RCM will be activated (e.g. via terminal 3 of RCM) to provide a logical output via terminals 2, 2a, 9 and 10 for controlling solenoids for the relays R1 and R2 to operate the relays R1 and R2 for the scanning operation. Relays R1 and R2 are connected to wires in the 7-way cord 16 for powering the turn signals and the brake lights, and also to terminals 11, 12 and 13 of RCM for actuating the status indicator LEDs CR1, CR2 and CR3.

Before going into details regarding the RCM operation, two additional features shown in FIG. 3 will be noted. The first of these is the use of a fusible link 26 in the connection between the positive battery terminal and the circuit breakers CB1 and CB2. The purpose of this fusible link 26 is to prevent damage in the event that one of the circuit breakers malfunctions. The second feature is the inclusion of an auxiliary ground lead 28. Normally, grounding for testing will be accomplished by way of one of the cables of the 7-way cord 16 coupled to the negative battery terminal. The auxiliary ground lead 28 is provided to allow adequate grounding for testing if, for some reason, the normal grounding through the 7-way cord 16 is insufficent.

Figure 4:
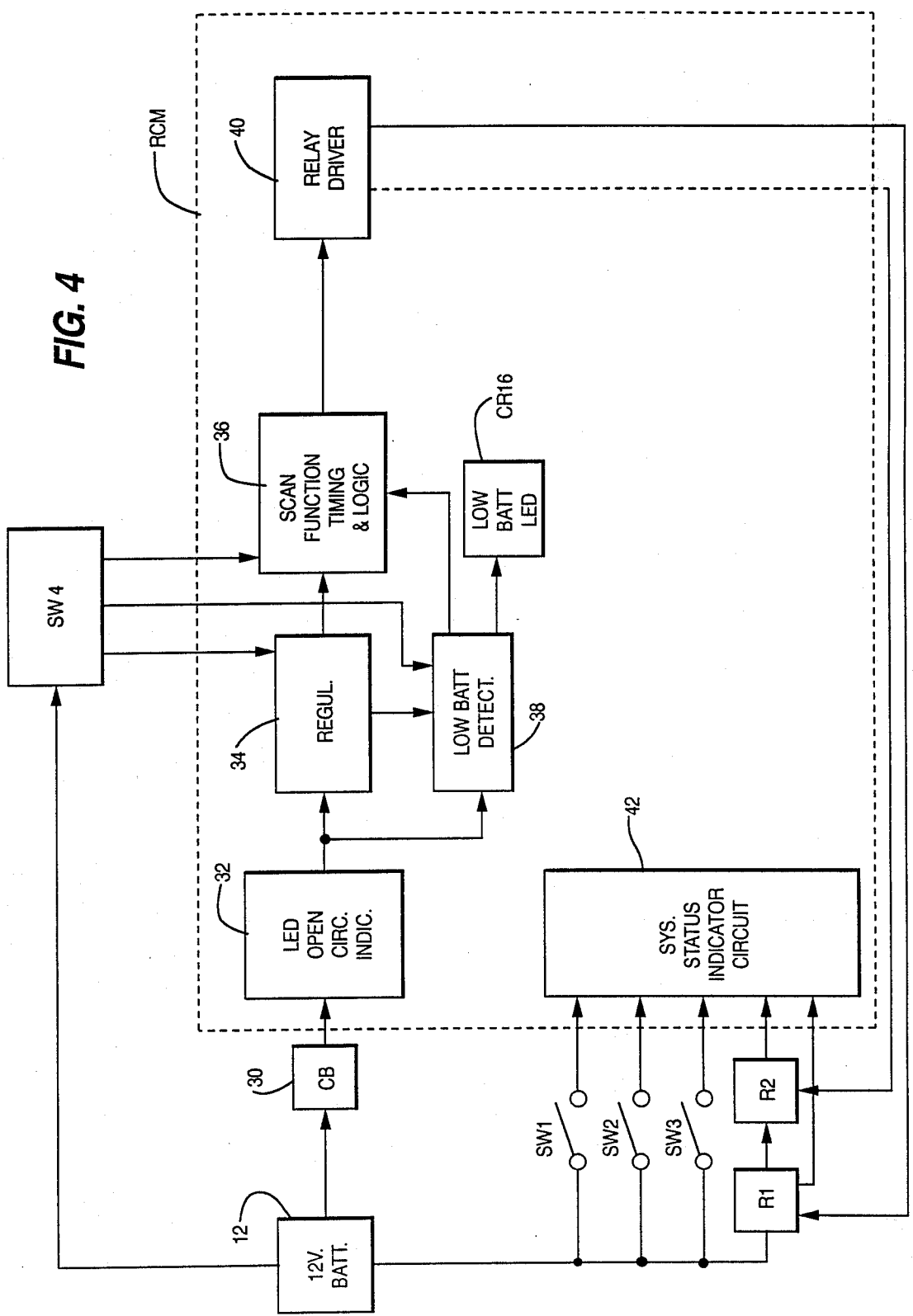
FIG. 4 is a block diagram of the relay control module RCM of FIG. 3.

Turning now to FIG. 4, a block diagram is provided to illustrate the main elements of the RCM operation. As can be seen there, the 12-volt battery 12 is coupled to RCM through the circuit breaker 30 (e.g. CB1 and CB2 of FIG. 3), which, in turn, is coupled to an LED open circuit indicator 32 within the RCM (e.g. see CR17 and CR18 in FIG. 5), as discussed previously.

The output of the LED open circuit indicator 32 (i.e. the DC supply voltage if an open circuit condition does not exist) is coupled to a DC power supply regulator 34 for providing a predetermined regulated DC voltage (e.g. typically 5 volts) to the scan function timing and logic circuit 36 and the low battery detection circuit 38. Switch SW4 determines whether the regulator 34 operates to provide a predetermined regulated DC voltage from the supply voltage. The low battery detector 38 operates, in accordance with the preferred embodiment, to provide two types of outputs. The first output will be to light the low battery indicator LED CR16 in a flashing mode. This occurs when the battery voltage is below a first predetermined voltage (e.g. 11 volts) but above a second predetermined voltage (e.g. 10 volts). The second output of the low battery detector will be to turn off the scan function timing and logic circuit 36 and to place the low battery LED indicator CR16 into a constant ON mode. This second output will occur if the battery voltage falls below the second predetermined voltage. This will serve to advise the testing operator that the testing battery is too low for adequate further testing. This will help prevent the testing operator from misconstruing a low testing battery for faulty lighting operation.

The scan function timing and logic circuit 36 is activated by the regulated output of the regulator 34 and controlled by the position of the switch SW4. When SW4 is in the AUTO position, the scan function timing and logic circuit 36 will operate to produce the predetermined sequence of logic outputs. This predetermined sequence of logic outputs is passed to the relay drive circuit 40. The relay drive circuit 40, in turn, controls the solenoids for the relays R1 and R2 to produce the sequence of left turn signal, brake light, right turn signal discussed previously.

On the other hand, when switch SW4 is in its FRZ position, it will provide an output to the scan function timing and logic circuit 36 to stop further scanning. Therefore, the tester will maintain whatever logic output state the scan function timing and logic circuit 36 was in at the moment the switch SW4 was switched into the FRZ position.

RCM also includes a system status indicator circuit 42. This circuit includes the LEDs CR1, CR2, CR3, CR7, CR8 and CR9 to provide an indication of the present status of the testing on the control panel 14, as discussed previously. As shown in FIG. 4, this system status circuit 42 is coupled to the switches SW1, SW2, SW3 and the relays R1 and R2 to provide the status indication.

FIG. 5 provides a detailed schematic circuit of the block diagram of RCM shown in FIG. 4. Circuit elements corresponding to the blocks in FIG. 4 have been identified with dashed lines formed around the circuit elements. A detailed description of the operation of FIG. 5 will now be provided.

As noted previously, switch SW4 acts as the module power switch for RCM. The module RCM is OFF when the switch SW4 is in the center position, and is on in either of the other two positions. Diode CR22 provides reverse polarity protection for the control circuitry. A voltage regulator AR4 (commercially available from Motorola under part No. LM317LZ) forms the regulated DC supply circuit 34 together with resistors R19, R20, R21 and capacitor C1. The output of the regulated DC supply voltage is provided to the scan function timing and logic circuit 36 and the low battery circuit 38. When switch SW4 is ON, capacitor C1 charges to the battery voltage and reduces the effect of minor dips in voltage due to the switching loads. The voltage at the output of the voltage regulator AR4 is set at about 5 volts DC in the preferred embodiment.

Resistors R25 and R27 form a resistive divider for the 5-volt DC regulated supply from the circuit 34, and the voltage at the pin 6 of the operational amplifier AR5 will act as a reference. Resistors R14 and R16 form a resistive divider from the cathode of diode CR22. When the battery voltage falls below 11 volts, the voltage on pin 5 of operational amplifier AR5 will be less than the reference voltage at pin 6 of AR5. This causes the output of AR5 (pin 7) to go low activating the initial low battery indication (e.g. LED CR16 flashing). When the battery voltage falls below 10 volts, a similar circuit consisting of resistors R12, R13, R15 and R17 causes the output of the operational amplifier AR3 to go low. When the scan circuit is in the "left turn" mode, both relays R1 and R2 are deenergized, and the output of the operational amplifier AR7 is driven low. This stops the auto-scan function by pulling the capacitor C2 low through the diode CR21. This also changes the low battery indication at LED CR16 from flashing to a full ON condition.

With regard to the low battery detection circuit 38, it should be noted that the operational amplifiers AR3, AR5, AR6 and AR7 can be formed with a quad-operational amplifier such as that manufactured by National Semiconductor under the part No. LM2902N.

In the system status indicator circuit 42, the indicators CR7, CR8 and CR9 for the non-scanned circuits (e.g. auxiliary, marker and tail) contain blocking diodes CR10, CR11 and CR12 to provide reverse voltage protection. The LED current is limited by the resistors R2, R3 and R4. The input to the indicators CR1-CR3 and CR7-CR9 comes from the load side of the switches.

The scan function timing and logic circuit 36 is formed to have an oscillator circuit and a counter. Operational amplifier AR2 (which can be a dual-OP-AMP such as that manufactured under the part No. LM2904N by either National Semiconductor or Texas Instruments) and resistors R5, R6, R7 and R8 and capacitor C2 form the oscillator circuit. The square-wave output of this oscillator circuit will drive pin 10 of a 14-stage binary counter AR1 (commercially available from Philips under Part No. ECG4020BE or from RCA under part No. CD4020BE). The two output pins of the counter AR1 form the following logic truth table:

| Pin 3 | Pin 2 | Output |
| --- | --- | --- |
| 0 | 0 | Left turn |
| 0 | 1 | Right turn |
| 1 | 0 | Brake |
| 1 | 1 | Brake |

Pin 2 of the binary counter AR1 drives transistor Q1 of the relay drive circuit 40 which, in turn, drives the relay R2. Relay R2 switches power between the left and right turn indicators. Pin 3 of counter AR1 drives transistor Q2 of the relay drive circuit 40, which, in turn, drives the relay R1. This relay R1 switches power to the relay R2 or to the brake lights. This scheme provides twice the time in the brake position. Thus, in a preferred embodiment, the left turn signal and the right turn signal would each be activated for approximately 1.5 seconds in the scanning sequence while the brake light would be activated for approximately 3 seconds.

The transistors Q1 and Q2 are preferably power MOSFET devices for driving single-pole-double-throw relays. Flyback diodes CR13 and CR14 are included in the relay drive circuit 40 to suppress the inductive voltage spikes created during turn-off of the relay coils. The power circuits are protected from shorts by the auto-reset thermal breakers CB1 and CB2 (e.g. FIG. 3). Front panel indication of the open breaker status is provided by LEDs CR17 and CR18 in the open circuit indicator circuit 32, as discussed previously.

With regard to the freeze operation of the switch SW4, it should be noted that this is carried out by connecting the terminals 4 and 5 of RCM through the switch SR4 when SR4 is in its lower FRZ position (e.g. pins 4 and 6 of SW4, as shown in FIG. 3). When this occurs, pins 8 and 11 of the counter AR1 are controlled to stop the counter operation. In this case, as noted previously, the logic state of the counter AR1 will be frozen in the state which exists at the moment SW4 was switched into its FRZ mode. This will allow the operator to isolate on the operation of a single lighting circuit for further study.

Figure 6:
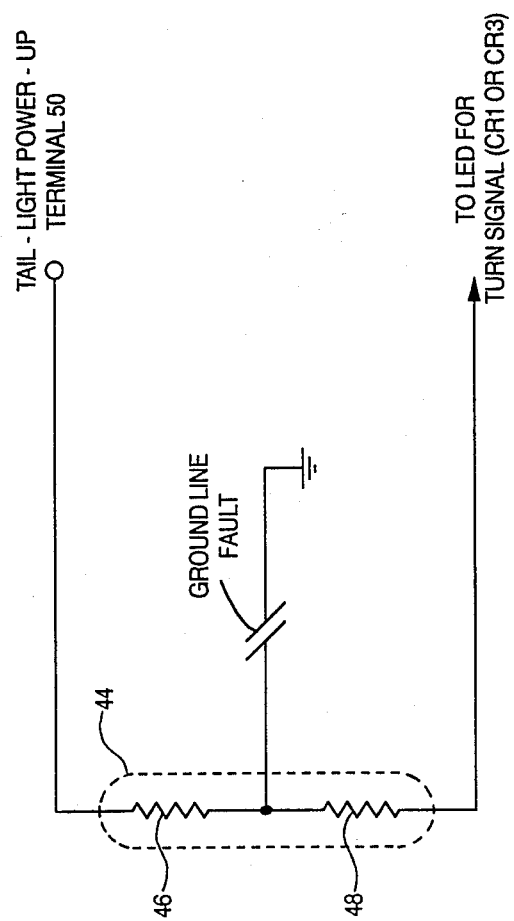
FIG. 6 is a schematic circuit diagram showing the operation of the system to detect a bad ground connection for a taillight being tested.

The above discussion has covered various aspects of the present invention including the scanning function, testing auxiliary, marker and taillights, short-circuit detection, system status, freeze mode, etc. However, as previously mentioned, the present invention can also be used to detect faulty ground connections. This is accomplished in a manner shown in FIG. 6. Specifically, in FIG. 6, a taillight bulb 44 typically will include a filament 46 for the taillight and a filament 48 for the turn signal indicator. Normally, when the switch SW3 is turned on for taillight activation, the taillight power-up will be provided to the taillight filament 46 through the terminal 50 and then passed to ground. However, if the ground is faulty, the taillight power will proceed through the turn signal filament 48 to the turn signal LED CR7 or CR9 on the side of the vehicle where the faulty ground occurs. Although this will be a very small amount of current, because LEDs are used in the present invention, it will be sufficient to light the LEDs CR7 or CR9. This will advise the testing operator that a bad ground situation exists for the taillight being tested. Of course, this arrangement is not limited to taillights, and could be provided with suitable dual-filament arrangements for any of the lights being tested.

Regarding the detection of short circuits and faulty grounds, it is to be noted that prior arrangements such as shown in the Eichelberger U.S. Pat. No. 3,103,808 have provided ammeters in the test equipment to provide an indication of the current flowing to the tested circuits. Such an ammeter arrangement has a number of disadvantages when compared with the arrangements of the present invention. For example, there are a large number of light configurations commonly used on trailers. Therefore, the actual correct current draw is generally not known. Further, an ammeter cannot confirm whether the wiring is correct (i.e. that the right and left sides are not cross-wired). It will also not detect grounding troubles in multi-filament bulbs in the manner discussed above with regard to FIG. 6. Further, the ammeter cannot discern current leakage caused, for example, by a broken wire that ends in a piece of ice, salt, dirt, etc., and the current draw due to bulb operation. And, of course, problems such as broken lenses, dirty lenses, etc., cannot be detected electrically by an ammeter. Finally, the use of an ammeter in conjunction with dead shorts and current spikes would require special wiring to avoid destruction of the ammeter, which does not appear to be taught by the Eichelberger arrangement.

From the above discussion, it can be seen that the present invention has numerous features and advantages over prior art arrangements. Of course, a primary feature of the present invention is the scanning feature which permits a single operator to check all of the vehicle lights in a single trip around the vehicle. This is augmented by the ability to detect short circuits with the auto-reset arrangement, the ability to detect faulty ground connections, the freeze feature, the low battery detection feature (including the turn-off of the scanning circuit) and the convenient system status indicator arrangement. Further, the molded enclosure 10 with the capability of safely carrying a testing battery in a manner to avoid acid spills on the operator and to maximize protection in the case of battery explosion is a significant feature both in terms of safety and convenience.

Although the present invention has been discussed in conjunction with the use of a testing battery, it could, of course, be used together with a AC/DC converter to supply power to the testing apparatus. Also, the present invention is not limited to 12-volt batteries since, obviously, other voltage levels could be used. This would be particularly the case when the present invention is being used for vehicles other than freight trailers which might require different standard voltages.

Also, although particular details of the circuit construction and operation have been provided in accordance with a preferred embodiment, the present invention is not intended to be limited to this. For example, although a preferred sequence of left turn signal, brake light, right turn signal has been provided, the present invention is certainly not limited to this sequence. Further, other lights could be brought into the sequence, if desired. And, of course, the times for keeping the various lights on and the voltages discussed are not limiting since other time periods and voltages could readily be used.

Still further, although the preferred circuit elements and connections have been shown in detail, other elements and arrangements could be used without departing from the scope of the present invention. Thus, although LED indicators are preferred, other forms of indicators could be provided on the control panel. Also, although the scanning circuit arrangement has been described in conjunction with a 14-stage binary counter, other scanning arrangements could be used instead.

It is to be understood that the above-described arrangements are simply illustrative of the application of the principles of this invention. Numerous other arrangements may be readily devised by those skilled in the art which embody the principles of the invention and fall within its spirit and scope.

I claim:

1. A vehicle light testing system for testing a lighting system of a vehicle having a right directional flashing lit, a left directional flashing light and a brake function, wherein said testing system comprises:
    means fo coupling the testing system to the vehicle lighting system; and
    a voltage power supply means; and
    means coupled to said lighting system through said coupling means ad coupled to said voltage power supply means for automatically scanning the lights of said lighting system to apply voltage from the voltage power supply means to said lights to activate said lights in accordance with a predetermined sequence so that said left and right directional flashing lights and said brake light function are operated repetitively in accordance with said predetermined sequence so that a single testing operator can check the operation of the left and right directional flashing lights and the brake light function in a single trip around the vehicle, wherein said scanning means operates to respectively carry out the predetermined scanning sequence automatically and independently so that the operator can check the different light operating functions during the single trip without having to carry the testing system or communicate with it during the 2. A vehicle testing system according to claim 1, wherein said voltage power supply means includes means coupled to said scanning means for providing said voltage applied to said lighting system of said vehicle by said scanning means independently of any power source within the vehicle.

3. A testing apparatus according to claim 2, wherein said testing system is located in an enclosure and wherein said voltage power supply means is a testing battery housed within said enclosure, and further wherein said vehicle testing system is a portable system capable of being carried in one hand.

4. A vehicle testing system according to claim 1, wherein said predetermined sequence is set for said scanning means so that said brake light remains on for a longer period of time than the time period during which each of said directional flashing lights remains on.

5. A vehicle testing system according to claim 4, wherein said predetermined seuence is set for said scanning means such that each of said right and left directional flashing lights is operated for the same predetermined amount of time, and said brake light is operated for twice said predetermined amount of time.

6. A vehicle testing system according to claim 5, wherein said right and left directional flashing lights are each operated for about 1.5 seconds and said brake light is operated for about 3 seconds in each cycle of said predetermined sequence.

7. A vehicle testing system according to claim 1, wherein each cycle of said predetermined sequence is set so that the sequence of operation proceeds from said left turn signal to said stop light to said right turn signal.

8. A vehicle testing system according to claim 4, wherein each cycle of said predetermined sequence is set so that the sequence of operaion proceeds from said left turn signal to said stop light to said right turn signal.

9. A vehicle testing system according to claim 1, wherein said lighting system includes additional lights, and wherein said testing system includes means coupled to said coupling means for separately activating said additional lights independently of said predetermined sequence.

10. A vehicle testing system according to claim 1, wherein said testing system includes means coupled to said scanning means for stopping said predetermined sequence at a predetermined point in the sequence to isolate the testing to a predetermined lighting operation.

11. A vehicle testing system according to claim 1, wherein said testing system includes a display panel coupled to said scanning means having indicator lights for indicating what point in the predetermined sequence the testing system is at.

12. A vehicle testing system according to claim 11, wherein said indicating lights are light emitter diodes.

13. A vehicle testing system according to claim 9, wherein said testing system includes a display panel coupled to said scanning means having indicating lights for indicating what point in the predetermined sequence the testing system is at, and further including second indicator lights for indicating which of said additional lights are being tested.

14. A vehicle testing system according to claim 1, wherein said testing system includes means coupled to said scanning means for determining whether a short circuit exists in the lights being tested, and means for indicating the existence of said short circuit.

15. A vehicle testing system according to claim 14, wherein said means coupled to said scanning means for determining whether a short circuit exists comprises an auto-reset circuit breaker which will go into an open circuit state when a short circuit occurs and which will reset automatically to a closed circuit state after a predetermined period of time, and further wherein said indicating means comprises an indicating light in said testing system for lighting when said auto-reset circuit breaker is in an open circuit state.

16. A vehicle testing system according to claim 1, wherein said testing system is located in an enclosure which includes an area for housing a testing battery for providing electric power to carry out the testing operation independently of any power source within the vehicle, and wherein said testing system further includes a low-battery checking means for determining whether said testing battery voltage has dropped below a predetermined voltage and for indicating that the testing battery voltage is below said predetermined voltage.

17. A vehicle testing system according to claim 16, wherein said low-battery checking means includes means for determining whether said testing battery voltage has dropped below a first voltage but is still above a second voltage and means for determining whether the testing battery voltage has dropped below the second voltage, and wherein said low-battery checking means further includes means for providing a first indication if the testing battery voltage is between the first and second voltage and for providing a second indication when said testing voltage is below the second voltage.

18. A vehicle testing system according to claim 17, wherein said low-battery checking means includes means for turning on an indicating light in the testing system to indicate that the battery voltage is between the first and second voltages, and means for turning off the scanning means of the testing system when the testing battery voltage drops below said second voltage.

19. A vehicle testing system according to claim 18, wherein said testing battery is a 12-volt battery and wherein said first voltage is 11 volts and said second voltage is 10 volts.

20. A vehicle testing system according to claim 1, wherein said testing system includes means coupled to said scanning means for indicating that a light being tested in said lighting system has a poor ground connection.

21. A vehicle according to claim 13, wherein said lighting system includes taillights for right and left sides of said vehicle, wherein said taillights are each formed as a single bulb which include a first filament for the taillight operation and a second filament for the directional flashing light operation, and wherein said testing system further includes means coupled to said scanning means for indicating that a taillight being tested has a bad ground connection by lighting a light emitted diode for the directional flashing light indicator corresponding to the same side of the vehicle which has a poor ground connection for the taillight.

22. A testing apparatus for testing the lighting system of a trailier which lighting system includes a right turn signal, a left turn signal, a brake light function, a right taillight, a left taillight and top marker lights, wherein said testing apparatus includes:

a multi-prong cable connector for connecting the testing apparatus to the lighting system of said trailer;

a voltage power supply means;

means coupled to the light system through said cable connector and coupled to said voltage power supply means for automatically scanning the lights of said lighting system of said trailer by applying voltag to the lights from the voltage power supply means in accordance with a predetermined sequence so that said left and right turn signals and said brake light function are operated repetitively in accordance with said predetermined sequence and means for separately activating said right taillight, said left taillighted and said top marker lights independently of said predetermined sequence so that a single testing operatior can check the operation of the right turn signal, the left turn signal, the brake light, the right taillight, the left taillight and the top marker lights of the trailer in a single trip around the trailer, wherein said scanning means operates to respectively carry out the predetermined scanning sequence automatically and independently so that the operator can check the different light operating functions during the single trip without having to carry the testing system or communicate with it during the testing; and a control panel including first switching means for activating said scanning means and second switching means for activating said means for separately activating said taillights and said top marker lights, said control panel further including indicator lights for indicating which point in the predetermined sequence the test system is at and which lights have been activated by said means for activating said taillights and said top marker lights.

23. A vehicle testing system according to claim 22, wherein said indicator lights on said control panel are light emitting diodes 24. A vehicle testing system according to claim 22, wherein said testing apparatus is housed in an enclosure which includes an area for housing a testing battery for providing electrical power to carry out the testing operation independently of any power source within the vehicle, and wherein said testing system further includes a low-battery checking means for determining whether said testing battery voltage has dropped below a predetermined voltage and for indicating by an indicator light on the control panel that the testing voltage has fallen below said predetermined voltage.

25. A vehicle testing system according to claim 22, wherein said switching means on said control panel for activating said scanning means includes a switching position for stopping said predetermined sequence at a predetermined point in the sequence to isolate the testing to a predetermined lighting operation.

26. A vehicle testing system according to claim 22, wherein said testing apparatus includes means for determining whether a short circuit exists in the lights being tested and for indicating the existence of such a short circuit on the control panel.

27. A vehicle testing system according to claim 22, wherein said testing apparatus includes an auxiliary grounding clip for grounding the testing apparatus independently of the ground terminal of the testing battery.

28. A vehicle testing system according to claim 22, wherein said voltage power supply means includes means coupled to said scanning means for providing said voltage applied to said lighting system of said vehicle by said scanning means independently of any power source within the vehicle.

29. A testing apparatus according to claim 28, wherein said testing system is located in an enclosure and wherein said voltage power supply means is a testing battery housed within said enclosure, and further wherein said vehicle testing system is a portable system capable of being carried in one hand.

* * * * *